(12) United States Patent
Watanabe

(10) Patent No.: US 7,264,907 B2
(45) Date of Patent: Sep. 4, 2007

(54) PHOTOMASK HAVING CENTRAL AND PERIPHERAL LINE PATTERNS

(75) Inventor: Kunio Watanabe, Nara (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 499 days.

(21) Appl. No.: 10/802,052

(22) Filed: Mar. 17, 2004

(65) Prior Publication Data

US 2004/0196447 A1 Oct. 7, 2004

(30) Foreign Application Priority Data

Mar. 26, 2003 (JP) ............................. 2003-085281

(51) Int. Cl.
*G03F 1/00* (2006.01)
(52) U.S. Cl. ....................................................... 430/5
(58) Field of Classification Search ................... 430/5, 430/30, 296
See application file for complete search history.

(56) References Cited

U.S. PATENT DOCUMENTS 5,966,201 A * 10/1999 Shiraishi et al. ............. 355/53
6,778,275 B2 * 8/2004 Bowes ........................ 356/400
6,921,916 B2 * 7/2005 Adel et al. ................... 257/48
6,986,973 B2 * 1/2006 Yao et al. ...................... 430/5

OTHER PUBLICATIONS

A. Bourov et al., "Impact of Flare on CD Variation for 248nm and 193nm Lithography Systems", *Proceedings of SPIE*, vol. 4346 (2001), pp. 1388-1393, Rochester, NY.
E. Luce et al., "Flare impact on the intrafield CD control for sub-0.25 μm patterning", Proceedings of *SPIE*, vol. 3679, Mar. 1999, pp. 368-381, Santa Clara, CA.
D. Nam et al., "Effectiveness and Confirmation of Local Area Flare Measurement Method in Various Pattern Layouts", *Proceedings of SPIE*, vol. 4691 (2002), pp. 57-66, Korea.
C. Progler et al., "Zernike Coefficients: Are they really enough?", *Proceedings of SPIE*, vol. 4000 (2000), pp. 40-52, Hopewell Junction, NY.

* cited by examiner

*Primary Examiner*—S. Rosasco
(74) *Attorney, Agent, or Firm*—Leydig, Voit & Mayer, Ltd.

(57) ABSTRACT

Each of patterns on two types of photomasks, including identical central pattern portions, each having a line pattern on the center of a substrate, and peripheral pattern portions around the central pattern portions, and having distances between the central pattern portion and the peripheral pattern portion different from each other, is transferred onto a wafer. Thereafter, each line width of the transferred patterns corresponding to the line pattern of each photomask is measured. The difference between each of line widths is obtained, from which the flare rate is calculated.

5 Claims, 12 Drawing Sheets

314

314

PHOTOMASK HAVING CENTRAL AND PERIPHERAL LINE PATTERNS

BACKGROUND OF THE INVENTION

1. Field of the Invention

The present invention relates to a photomask, a flare measuring mechanism, a flare measuring method, and an exposing method. More specifically, the present invention relates to a photomask used for measuring flare caused by aberration of projection lens in an exposing apparatus used in a process for manufacturing a semiconductor device; and a flare measuring mechanism, a flare measuring method, and an exposing method using such a photomask.

2. Background Art

Generally in the manufacture of a semiconductor device, pattern transfer using a lithographic process is performed in various stages. In this process, light from an exposing light source is radiated onto a photomask including a desired pattern. After the light is converged in a projection lens, the converged light is radiated onto a wafer. Thereby, the resist on the wafer is exposed. If the resist used is a positive-type resist, the exposed region is partially dissolved and removed during developing. Thus, the mask pattern is transferred onto the wafer.

During developing, however, flare may be caused by fine irregularity of the projection lens penetrated by the exposing light, or by scattered light. Flare may deteriorate the contrast of the exposing light that plays an important role in the formation of element patterns and lower the exposing margin in the exposure of the fine patterns, or may bring about deterioration of the shapes of fine patterns.

Therefore, flare is measured for every mask pattern, and compensation for the effects of flare during exposing has been tried using the measured flare.

FIG. 16 is a sectional view for illustrating a conventional photomask used for measuring flare; FIG. 17 is a top view thereof; and FIGS. 18A-18C are schematic top views showing the change of the shape of the transferred resist pattern when exposure is changed in the exposure using the conventional photomask. exposure using the conventional photomask.

In general, for the calculation of the flare rate, the Kirk method (box-in-box method) is used. The measurement of the flare rate by the Kirk method will be described below referring to FIGS. 16 to 18C.

As FIGS. 16 and 17 show, the photomask used for measuring the flare rate by the Kirk method includes, as in ordinary photomasks, a pattern on a substrate that is transparent to exposing light comprising a light-shielding film such as a chromium film. The layout of the photomask 300 is as follows: A square central light-shielding portion 304 is first formed on the center of a transparent substrate 302, and an open portion 306, which is the portion wherein no light-shielding portions are located, is formed to surround the central light-shielding portion 304. On the peripheral portion of the surface of the transparent substrate 302, outside the open portion 306, a peripheral light-shielding portion 308 surrounds the open portion 306.

After the flare rate is measured, the pattern is transferred using the photomask 300. At this time, exposure is changed to transfer the pattern.

For example, FIG. 18A shows an ordinary transferred pattern, and, if exposure is increased from this state, the quantity of light received by the photoresist increases gradually, and, as FIG. 18B shows, the quantity of the removed resist increases. If the exposure is further increased, the transferred pattern 314 formed by imaging the central light-shielding portion 304 on the wafer gradually becomes smaller, and, finally, the transferred pattern 314 disappears as shown in FIG. 18C.

Here, the flare rate measured by the Kirk method is defined as the following equation (1):

$$\text{Flare rate}(\%) = X/Y \times 100 (\%) \qquad (1)$$

where X is the exposure dosage in the case wherein a pattern is transferred as normally designed as shown in FIG. 18A, and Y is the exposure dosage in the case wherein the transferred pattern 314 corresponding to the central light-shielding portion 304 is disappeared as shown in FIG. 18C.

In other words, in the Kirk method, flare is defined as the ratio of (i) the exposure dosage when the photoresist corresponding to the open portion 306 is removed, adequately leaving the photoresist corresponding to the light-shielding regions 304 and 308, to (ii) the exposure when all the photoresist pattern corresponding to the central light-shielding portion 304 is removed. This is defined utilizing the phenomenon that the larger the flare of the projection lens in the exposing apparatus, the easier the resist pattern of the central light-shielding portion 304 on the center of the mask layout is removed.

However, when the Kirk method is used as described above, if the width of the open portion 306 is reduced to some extent, the resist within the central light-shielding portion 304 no longer disappears. Therefore, in recent exposures for forming increasingly miniaturized patterns, the measurement of the flare rate for the pattern with a narrow opening portion using the Kirk method has become difficult.

In addition, it is considered that flare produced in exposing consists generally of long-range flare and local flare. Further, local flare consists of the factor that causes dimensional variation of the exposed pattern on the wafer separated by several micrometers to several tens of micrometers due to the non-uniformity of the refraction index (midrange flare), and wave aberration inherent to the projection lens (shortrange flare; the disagreement of phase lag such as an anastigmatic, coma, or spherical flare including defocusing or distortion, caused by reticle transmission of exposing diffractive light through various films, such as reticles or lenses) is referred to as local flare. In particular, it is difficult to measure local flare using the conventional Kirk method.

Concurrent with the miniaturization of patterns, exposing light or shorter wavelength has been used, and the use of an $F_2$ laser as exposing light is taken into account. When an $F_2$ laser is used, a conventional projection lens consisting of quartz ($SiO_2$) cannot provide sufficient transmittance. Therefore, the use of the projection lens using fluorite ($CaF_2$) can be considered. However, the projection lens consisting of fluorite ($CaF_2$) has large non-uniformity of refraction index due to double refraction, and large roughness of the lens surface. Therefore, if fluorite ($CaF_2$) is used as the material of the projection lens, more flare occurs as compared with the conventional lens consisting of quartz ($SiO_2$). The flare is divided into several components, depending upon its cause, and becomes complicated. Therefore, accurate measurement of flare by the Kirk method has become still more difficult.

However, as the wavelength of the exposing light becomes shorter, the region affected by local flare becomes smaller, but the intensity of local flare is considered to increase. Therefore, it is considered that the effect of the use of shorter wavelength on the line width of the transferred pattern becomes too large to ignore. It is therefore important to correctly know the effect of local flare.

SUMMARY OF THE INVENTION

Therefore, the present invention proposes a photomask, and a mechanism and a method for measuring the flare rate that are improved so as to measure flare rates, particularly local flare rates corresponding to miniaturized patterns more exactly even when the open portion is small.

According to one aspect of the present invention, a photomask have a pattern formed on a substrate composed of a material permeating exposing light by providing light-shielding portions using a material that shields said exposing light. The pattern comprises a central pattern portion having a plurality of line patterns formed leaving a predetermined distance on the central portion of said substrate; and a peripheral pattern portion formed in the vicinity of the peripheral portion of said substrate so as to surround said central pattern portion.

According to another aspect of the present invention, a flare measuring mechanism comprises a first photomask, a second photomask and a calculation means.

The first photomask comprises a first central pattern portion and a first peripheral pattern portion. The first central pattern portion is formed of a first line pattern on the central portion of a substrate. The first peripheral pattern portion is formed so as to surround said first central pattern portion.

The second photomask comprises a second central pattern portion and a second peripheral pattern portion. The second central pattern portion is formed of a second line pattern of the same shape as said first central pattern portion. The second peripheral pattern portion is formed so as to surround said second central pattern portion. Further, in the second photomask, the distance between said second central pattern portion and said second peripheral pattern portion is different from the distance between said first central pattern portion and said first peripheral pattern portion.

The calculation means is for measuring a flare rate by transferring each pattern on said first and second photomasks, measuring the line width of each of patterns transferred first and second line pattern, and calculating the difference between the line width of the pattern corresponding to said first line pattern and the line width of the pattern corresponding to said second line pattern.

According to another aspect of the present invention, in flare measuring method, a first pattern of a first photomask and a second pattern of a second photomask are transferred, respectively, the line width of said first line pattern transferred and of said second line pattern transferred are measured, respectively, and then, the flare rate is calculated.

Here, the first photomask comprises said first pattern including a first central pattern portion and a first peripheral pattern portion. The first central pattern portion has a first line pattern formed on the center of a substrate. The first peripheral pattern portion is formed around said first central pattern portion, onto the substrate.

A second the second photomask comprises said second pattern including a second central pattern portion and a second peripheral pattern portion. The second central pattern portion has a second line pattern same as said first line pattern formed on the center of a substrate. The second peripheral pattern portion is formed around said second central pattern portion, onto the substrate. Further, in the second photomask, the distance between said second central pattern portion and said second peripheral pattern portion is different from the distance between said first central pattern portion and said first peripheral pattern portion.

The flare rate is calculated by obtaining the difference between the line width measured and the line width measured.

According to another aspect of the present invention, in an exposing method, a flare rate is inputted and the difference in line width at a flare rate from said flare rate on the basis of 0% flare rate is calculated. Then, the corrected exposure from said difference in line width is calculated for controlling exposure on the basis of said corrected exposure.

Other and further objects, features and advantages of the invention will appear more fully from the following description.

DETAILED DESCRIPTION OF THE PREFERRED EMBODIMENTS

Figure 1:
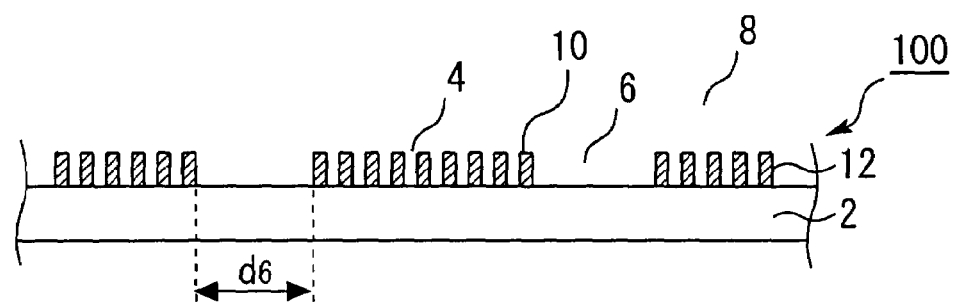
FIG. 1 is a schematic sectional view for illustrating a photomask in the first embodiment of the present invention.

The embodiments of the present invention will be described below referring to the drawings. In the drawings, the same or like parts will be denoted by the same reference numerals and characters, and the description thereof will be omitted or simplified.

First Embodiment

Figure 2:
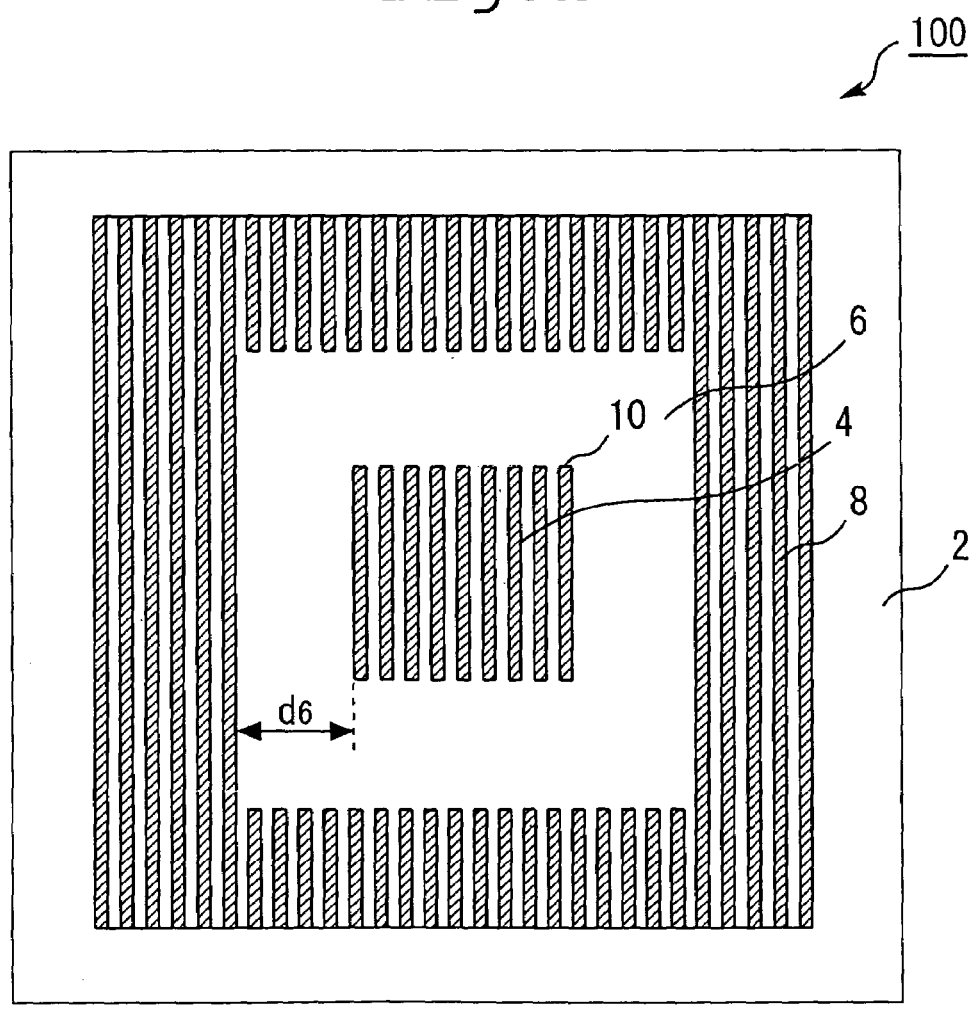
FIG. 2 is a schematic top view of the photomask in the first embodiment of the present invention.

FIG. 1 is a schematic sectional view for illustrating a photomask 100 in the first embodiment of the present invention. FIG. 2 is a schematic top view of the photomask 100.

As FIG. 1 shows, the photomask 100 is composed of a substrate 2, a central pattern portion 4 formed on the central portion of the substrate 2, an open portion 6 formed so as to surround the central pattern portion 4, and a peripheral pattern portion 8 formed so as to surround the open portion 6.

The substrate 2 is formed from quartz glass having a transmittance of 85% or more, considering the use of $F_2$ excimer laser beams of a wavelength of 157.6 nm as exposing light. The size of the substrate 2 is 6-inch square and 0.25-inch thick.

A line-and-space (L/S) pattern is formed on each of the central pattern portion 4 and the peripheral pattern portion 8. Line patterns 10 and 12 on the central pattern portion 4 and the peripheral pattern portion 8 are formed of a light-shielding material. As the light-shielding material, chromium (Cr) having an optical density of 3 or more, and a transmittance of 0.1% or less, considering the use of short-wavelength light such as $F_2$ excimer laser beams of a wavelength of 157.6 nm. The film thickness of each of line patterns 10 and 12 (height of line patterns 10 and 12 in FIG. 1) is 60 nm or more.

The line pattern 10 formed on the central pattern portion 4 is formed to have a line width of $\lambda/NA$, where $\lambda$ is the wavelength of the exposing light of the exposing apparatus used for transferring the patterns, and NA is the numeric apertures of the projection lens. A total of 9 line patterns 10 are disposed on the central pattern portion 4 in parallel at an interval of $\lambda/NA$. In other words, the central pattern portion 4 has a 1:1 line-and-space pattern with a line width of $\lambda/NA$. The line length of the line pattern 10 is 10 μm or more.

The open portion 6 is only an area of the substrate 2 where no light-shielding portions are formed. When flare is measured, two photomasks prepared to have the width of the open portion 6 $d_6$ different from each other. Therefore, each photomask has the different width of the peripheral pattern portion 8 depending on the width of the open portion 6 $d_6$.

The line width of the line pattern 12 of the peripheral pattern portion 8 is also $\lambda/NA$, the same as the width of the line pattern 10 of the central pattern portion 4. The distance between the patterns 12 is also $\lambda/NA$. In other words, the peripheral portion 8 has a 1:1 line-and-space pattern with a line width of $\lambda/NA$; and the length of long line patterns on the peripheral portion of the peripheral pattern 8 is about 100 μm.

Figure 3:
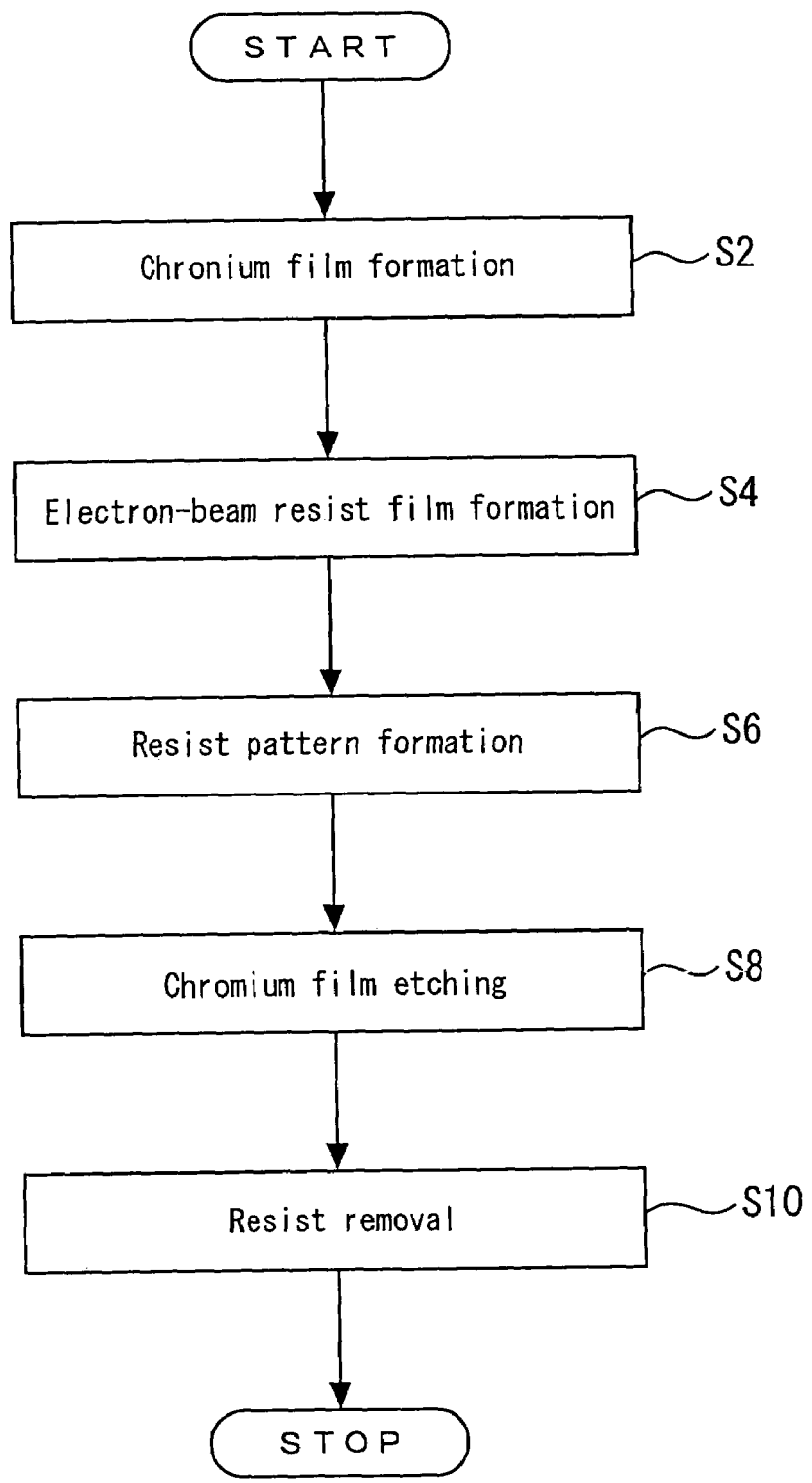
FIG. 3 is a flow diagram illustrating the manufacturing method of a photomask in the first embodiment of the present invention.
Figure 4:
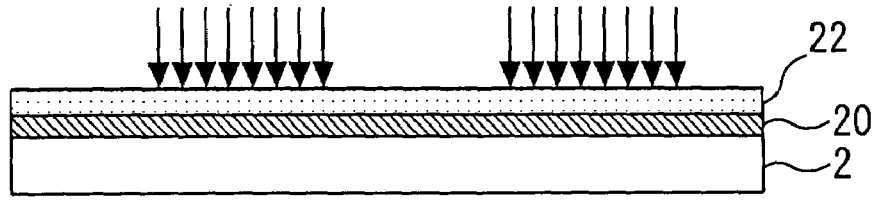
FIGS. 4 to 6 are schematic diagrams for illustrating the state in each manufacturing step of the photomask in the first embodiment of the present invention.
Figure 5:
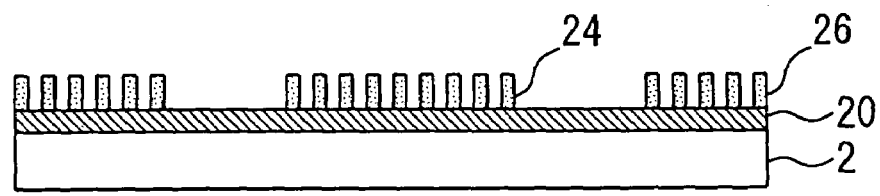
Figure 6:
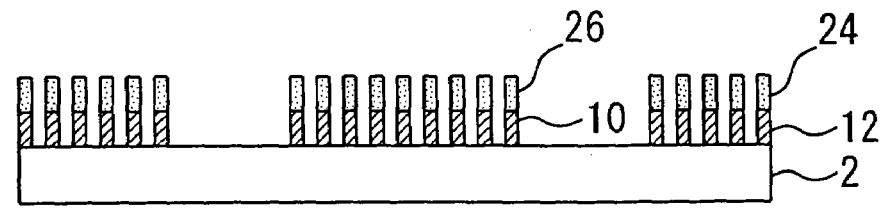

FIG. 3 is a flow diagram illustrating the manufacturing method of a photomask 100 in the first embodiment of the present invention. FIGS. 4 to 6 are schematic diagrams for illustrating the state in each manufacturing step of the photomask 100.

A method for manufacturing a photomask 100 will be described below referring to FIGS. 3 to 6.

First, as FIG. 4 shows, a chromium film 20 is formed on a substrate 2 (Step S2), and an electron-beam resist film 22 is formed on the chromium film 20 (Step S4). Here, the chromium film 20 is formed to have a thickness of 60 nm or more so as to prevent the occurrence of defects such as pinholes. The electron-beam resist film 22 is formed using a positive-type resist.

Next, as FIG. 5 shows, using electron-beam exposure and developing, resist patterns 24 and 26 are formed on the electron-beam resist film 22 so as to correspond to line patterns 10 and 12, respectively (Step S6). Here, electron-beam exposure is first performed with a defined amount of electric charge required for resist resolution on the electron-beam resist film 22. Since the positive-type electron-beam resist film 22 is used, the film is not exposed in the area where the chromium film 20 will remain as line patterns, but electron-beam writes the space pattern portions of the central pattern portion 4 and the peripheral pattern portion 8, and the open portion 6.

Next, the chromium film 20 is etched using the resist pattern 26 as a mask (Step S8). Here, the parallel flat-plate reactive ion etching (RIE) method is employed. As the etching gas, $CCl_4$ (tetrachloromethane) and $O_2$ (oxygen) or $CH_2Cl_2$ (dichloromethane), controlled to a flow rate ratio of 1:3, are used. The etching selection ratio of the substrate 2 and the chromium film 20 is sufficiently secured during etching, and the dry-etching resistance of the electron-beam resist is sufficient. Therefore, the resist pattern 26 acts as a protective film against etching, and as FIG. 6 shows, the chromium film 20 is etched only on the area not coated by the resist pattern 26.

Next, the resist pattern 26 is peeled off (Step S10). A mixed solution of sulfuric acid and hydrogen peroxide in a ratio of 3:1 is used as the peeling solution. In this time, the etching resistance of the exposed substrate 2 and the chromium film 20 is sufficiently secured.

As described above, a patterned photomask 100 as shown in FIGS. 1 and 2 is formed.

Figure 7:
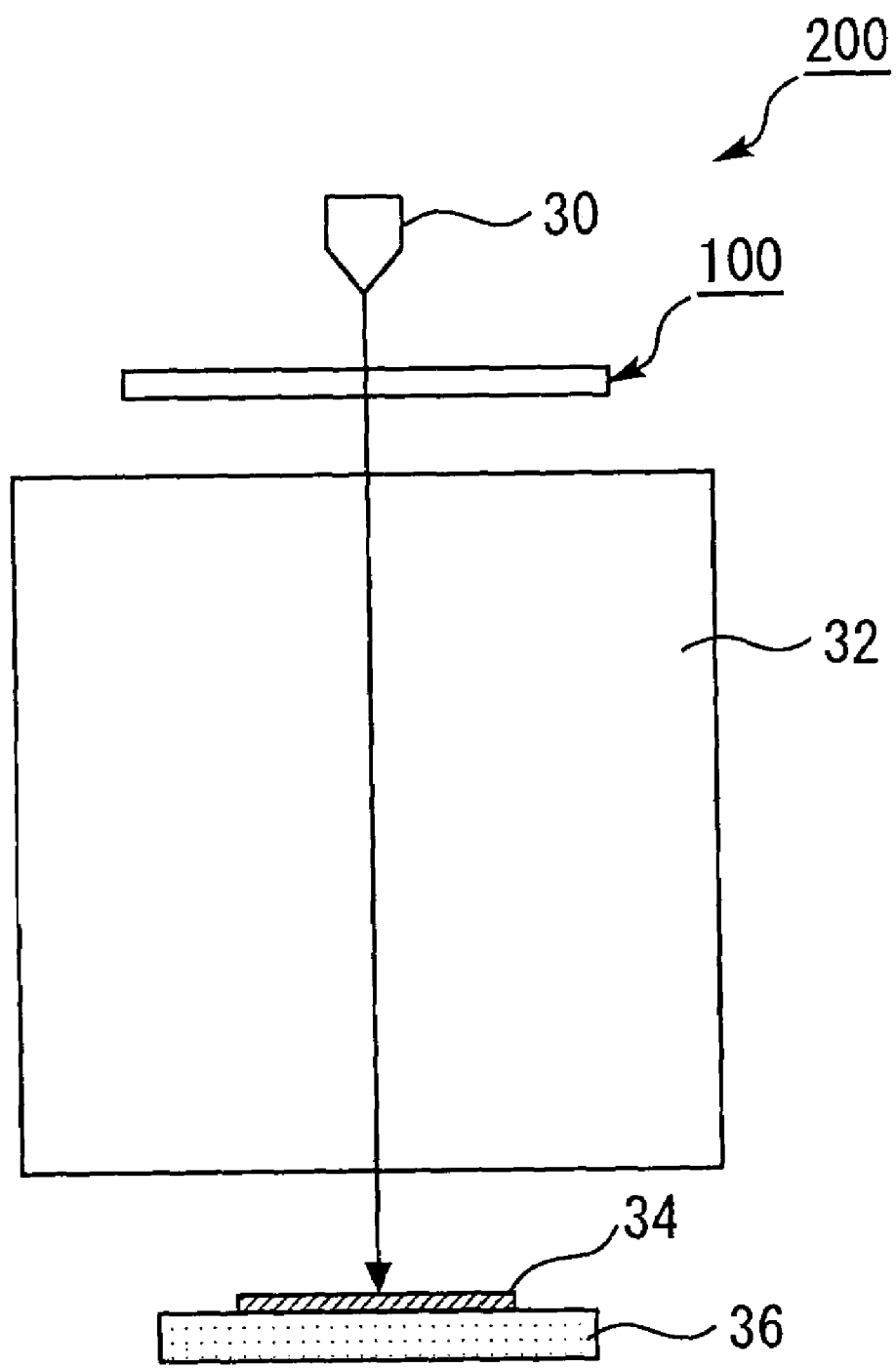
FIG. 7 is a schematic diagram for illustrating the exposing apparatus used in the first embodiment of the present invention.

FIG. 7 is a schematic diagram for illustrating the exposing apparatus 200 used in the first embodiment of the present invention.

As FIG. 7 shows, the exposing apparatus 200 used in the first embodiment is the same as a conventional ordinary exposing apparatus. Specifically, the exposing apparatus 200 is equipped with an exposing light source 30, and a projection lens 32 to receive light from the exposing light source; and a wafer stage 36 to place thereon a wafer 34 that is placed so as to receive light reduced to a predetermined reduction ratio by the projection lens.

Specifically, when the local flare rate is measured in the first embodiment, $F_2$ excimer laser is used as the exposing light source; and a projection lens 32 of a numerical aperture of 0.85, and a sigma (σ) of 0.7 is used.

When the local flare rate caused by the aberration of the projection lens of the exposing apparatus and the like is measured, the above-described photomask 100 is set in the exposing apparatus 200 as the photomask. On the other hand, a wafer 34 whereto a resist is applied is placed on the wafer stage 36. The wafer 34 has previously been subjected to pre-baking at about 100° C. for 60 seconds after application of the resist.

When the exposing apparatus 200 is used, the exposing light radiated from the exposing light source 30 is transmitted through the photomask 100. At this time, only the part of the photomask 100 whereon line patterns 10 and 12 are not formed transmits the exposing light. The transmitted light enters in the projection lens 32 and is converged, and the converged light is condensed on the wafer 34 to expose the resist on the wafer 34. Thereafter, after the wafer 34 has been subjected to baking at about 100° C. for 60 seconds, the exposed portion of the resist is removed by immersing in a developing solution of a concentration of about 2.38% for about 45 seconds to form the resist pattern.

Now, the line widths of the resist pattern corresponding to the line pattern 10 of the central pattern portion 4 transferred as described above will be compared.

Figure 8:
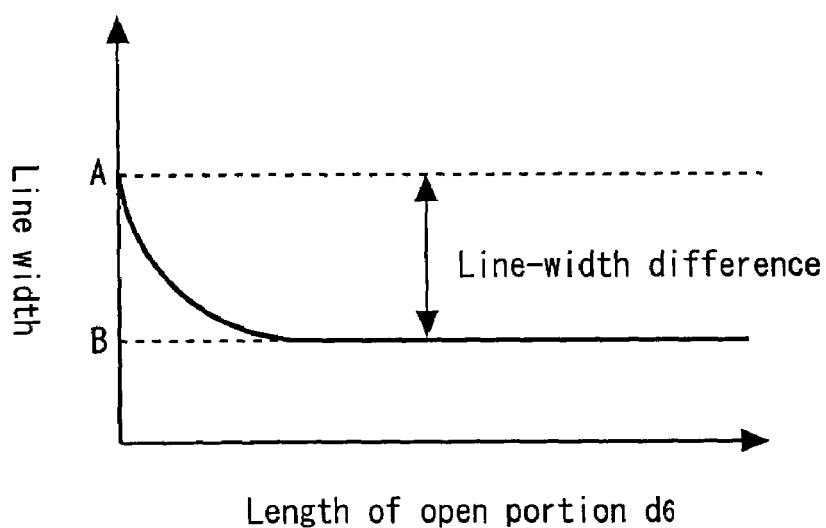
FIG. 8 is a graph showing the line width of the pattern to which the line pattern is transferred versus the length $d_6$ of the open portion.

FIG. 8 is a graph showing the line width of the pattern to which the line pattern 10 is transferred versus the length $d_6$ of the open portion 6.

As FIG. 8 shows, when the length $d_6$ of the open portion 6 is small, the line pattern 10 is transferred in an ideal line width substantially as designed. However, as the length $d_6$ of the open portion 6 increases, the line width of the transferred pattern is reduced, and difference from the line width as designed increases. Furthermore, when the length $d_6$ of the open portion increases to a certain extent, the difference in the line width no longer increases, and becomes constant even when the open portion is enlarged.

In the first embodiment, this is utilized to define the flare rate. Specifically, as the size of the open portion 6 is enlarged, the effect of flare increases, and becomes constant after the open portion 6 reaches a certain size. The flare rate is calculated from the difference between the line width of the pattern transferred in this constant state and the line width of the pattern transferred in the ideal state.

Figure 9:
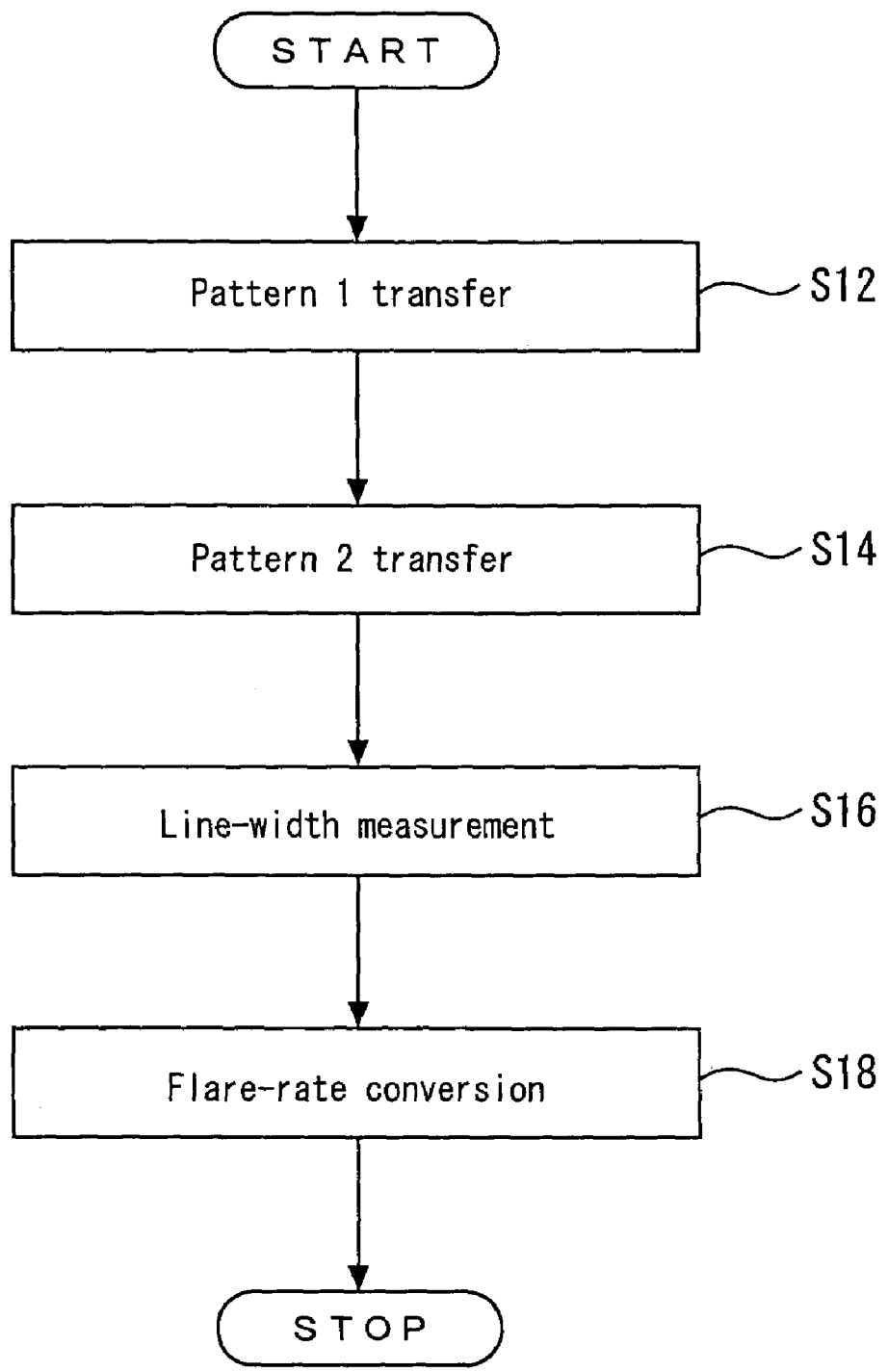
FIG. 9 is a flow diagram for illustrating the method for measuring the flare rate in the first embodiment of the present invention.
Figure 10:
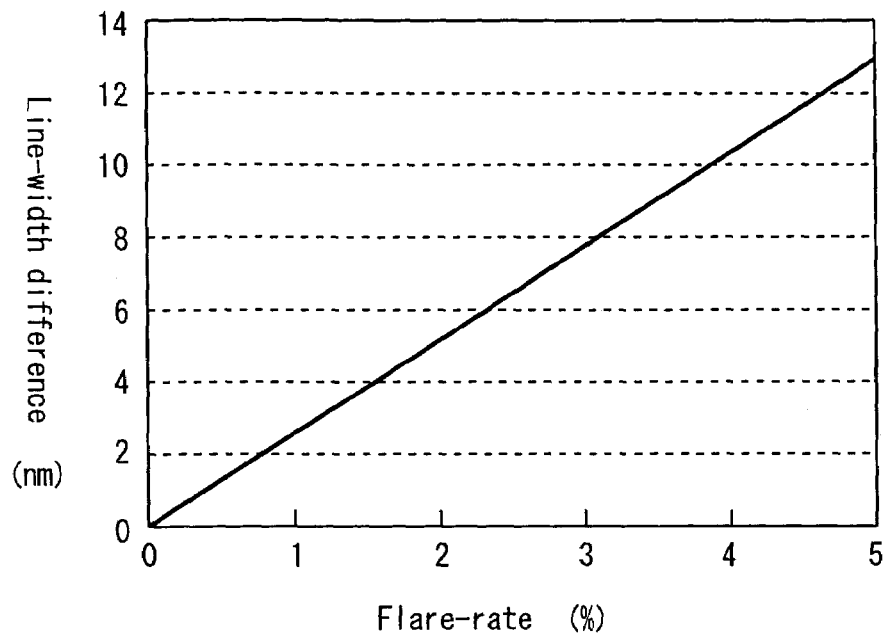
FIG. 10 is a conversion table from the line-width difference of the transferred pattern to the flare rate.

FIG. 9 is a flow diagram for illustrating the method for measuring the flare rate in the first embodiment of the present invention. FIG. 10 is a conversion table from the line-width difference of the transferred pattern to the flare rate.

The method for measuring the flare rate in the first embodiment will be described below referring to FIGS. 9 and 10.

Two types of photomasks are used for measuring flare rates. The first type of photomask has a pattern wherein the length $d_6$ of the open portion 6 is substantially zero, that is, a pattern wherein the central pattern portion 4 is close to the peripheral pattern portion 8, and the open portion 6 is actually not formed. The second type of photomask is a photomask wherein the length $d_6$ of the open portion 6 is large enough so that the difference in line widths no longer changes as described above. The first and second types of photomasks have only difference in the size of the open portion 6 and the accompanying size of the peripheral pattern portion 8, and the central pattern portion 4 has the same shape and the substrate 2 has also the same size.

First, the first photomask is set in the exposing apparatus 200, and light transmitted through the first photomask is radiated from the exposing apparatus 200 onto a predetermined region of the resist on the wafer 34 for exposure (Step S12).

Next, the second photomask is set in the exposing apparatus 200, and light transmitted through the second photomask is radiated from the exposing apparatus 200 onto the region different from the predetermined region on the same wafer as the wafer 34 exposed using the pattern of the first photomask (Step S14).

Next, the resist on the wafer 34 is developed, and the line width of the transferred pattern corresponding to 9 line patterns 10 of the first photomask is measured. Similarly, each line width of the transferred pattern corresponding to 9 line patterns 10 of the second photomask is measured (Step S16).

Here, each line width of the transferred pattern of the first photomask becomes the line width A in the ideal state in the graph of FIG. 8. Each line width of the transferred pattern of the second photomask becomes the line width B in the state wherein the line width is stabilized. Each difference between these line widths (A–B) is obtained.

Next, the flare rate is obtained using a conversion table, as FIG. 10 shows, for obtaining the flare rates from the line-width difference (Step S18). Thereby the flare rate can be obtained. For example, when the line-width difference A-B is 13 nm, the flare rate obtained using the conversion table is 5%.

Thereafter, the flare rate obtained using the conversion table is adjusted with the correcting factor.

Such a conversion table can be easily prepared using an optical simulator or the like. The specific method will be described below.

Figure 11:
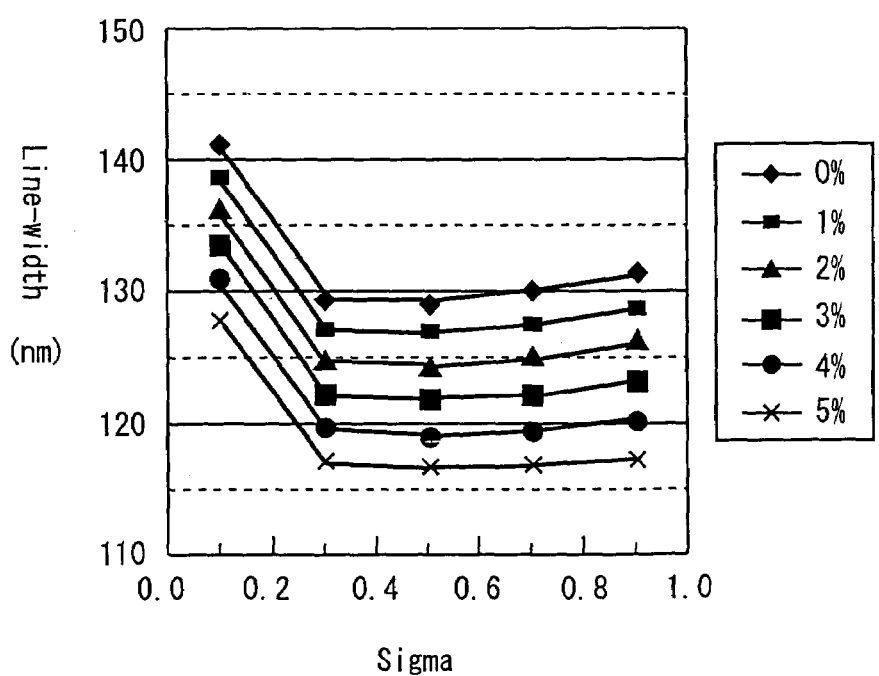
FIG. 11 is a graph showing the relationship between the line width and the size of the aperture (hereafter referred to as sigma).

FIG. 11 is a graph showing the relationship between the line width and the size of the aperture (hereafter referred to as sigma).

Light transmitted through an optical system may be scattered or reflected on the surface that should transmit the light, and as a result, background light, known as flare, is generated. The flare rate is the value representing the proportion of light that becomes flare with respect to light reaching a wafer, and is designated on the basis of the intensity of incident light. FIG. 10 shows change in the line width of the resist due to the proportion of the flare generated during exposure.

In order to prepare a conversion table as shown in FIG. 10, the relationship between the line width and sigma is obtained for every flare rate as FIG. 11 shows. FIG. 10 is a conversion table prepared by obtaining line-width differences for various flare rates on the basis of the line width when sigma is 0.7 and the flare rate is 0%. Specifically, the conversion table shows the line-width difference on the basis of certain illumination conditions and flare rates.

By the above-described method, each flare rate is calculated from the line width corresponding to each line pattern 10 of the central pattern portion 4. Although only one graph is shown herein, actually, the line-width difference depends on the location of each disposed line pattern 10 of the central pattern portion 4. In general, it is considered that since the effect of flare is large in the line patterns 10 in the vicinity of end portions, the line-width difference is large; and the line patterns 10 in the vicinity of the central portion, the line-width difference is small; however, by calculating the flare rate for each of line patterns 10, the portions much affected by flare, and the like, can be evaluated more specifically.

Thereby, patterns are miniaturized, and even when the measurement of the flare rate is difficult by the conventional Kirk method, the local flare rate caused by the high-order wave aberration can be easily obtained. Furthermore, since the relationship between the flare rate and the line-width difference is expressed by a linear expression, conversion can be easily performed.

In the first embodiment, although the width, length or the number of lines on the central pattern portion is specifically described, the present invention is by no means limited thereto. The width, length and the number of lines can be optional as long as the line-width can be accurately measured when a pattern is transferred. Specifically, as described in the first embodiment, although a line width of about λ/NA is preferable, it is considered, for example, that if a line width of about 150 nm to 250 nm for the excimer laser of a wavelength of 157.6 nm, the flare rate can be evaluated accurately. However, these values do not necessarily limit the scope of the present invention.

Similarly, in the present invention, the line width, length and the like of the peripheral pattern portion 8 are not limited to the values described in the first embodiment. In the present invention, the line width of the peripheral pattern portion 8 may be different from the line width of the central pattern portion 4, but the peripheral pattern portion 8 may have a 1:2 line-and-space pattern. Furthermore, the pattern is not limited to a line-and-space pattern. However, since the pattern form of the peripheral pattern portion 8 is considered to affect the line-width difference of the transferred pattern of the central pattern 4 for measuring flare, it is preferable to prepare a conversion table for obtaining the flare rate from the line-width difference depending on the form of the peripheral patterns.

In the measurement of the flare rate, comparison was made on the case of using the first photomask having no open portion 6, and the case of using the second photomask having an open portion 6 large enough to make the line width constant. This is because the use of the photomask in such a state is easy, and is distinct as the standard; however, the present invention is by no means limited thereto. The flare rate can be measured from a similar theory by comparing the line widths using two types of photomasks having different length $d_6$ of the open portion 6. In this case, a conversion table as shown in FIG. 10 must be prepared separately.

In the present invention, the exposing apparatus used for measuring the flare rate is not limited to the exposing apparatus 200 described in the first embodiment. By obtaining the flare rate using the other type of exposing apparatus that requires the measurement of flare of the lens as described in the first embodiment, the effect of flare on the exposing apparatus can be corrected.

The materials of the photomask, that is, the materials for the substrate 2 or for the formation of line patterns are not limited to quartz glass or chromium described in the first embodiment. These materials may be selected from materials having adequate transparency considering the wavelength of light used for exposure. It is preferable that the material for the substrate has a transmittance to the exposing light of 80% or more. The material for the light-shielding portion for the formation of line patterns has a transmittance of preferably 0.5% or less. As in the first embodiment, the material when a chromium film 20 is used may be chromium iodide, in addition to high-purity chromium particles (99.999%). However, although a high-purity chromium film can be obtained from chromium iodide than high-purity chromium particles, chromium iodide is expensive. Since the thin chromium film reflects light very well, the transfer accuracy may be lowered. Therefore, a chromium oxide film of a thickness of about 30 nm formed on the chromium film may be used as an antireflective film.

In the first embodiment, the case wherein each of steps for transferring the pattern of the wafer 34, measuring the line width, and obtaining the flare from the conversion table are performed using separate apparatuses, or by different operators. However, the present invention is not limited to thereto, but the incorporation of a system for measuring the line width and converting it to the flare rate, or a system for automatically controlling exposure of the exposing apparatus, can also be considered.

Second Embodiment

Figure 12:
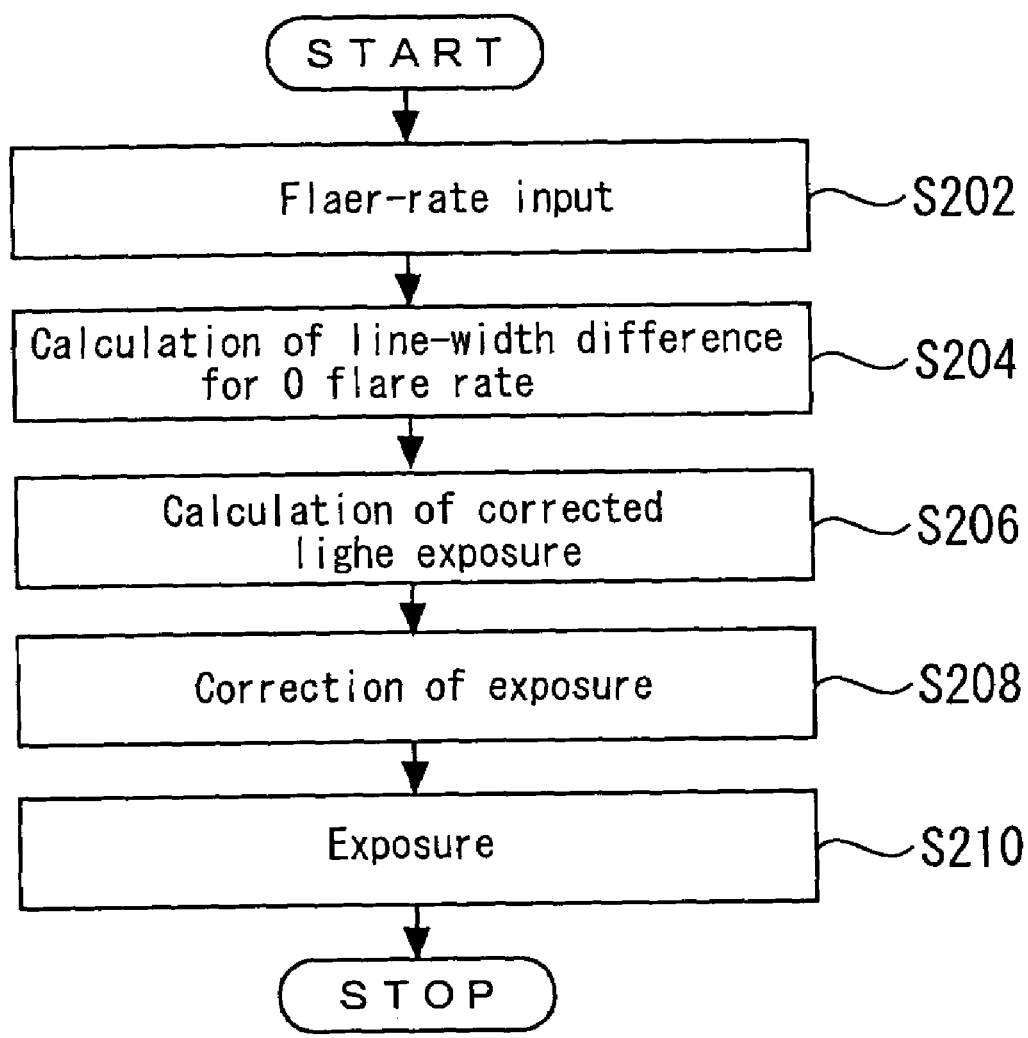
FIG. 12 is a flow diagram for illustrating the exposing method according to the second embodiment of the present invention.
Figure 13:
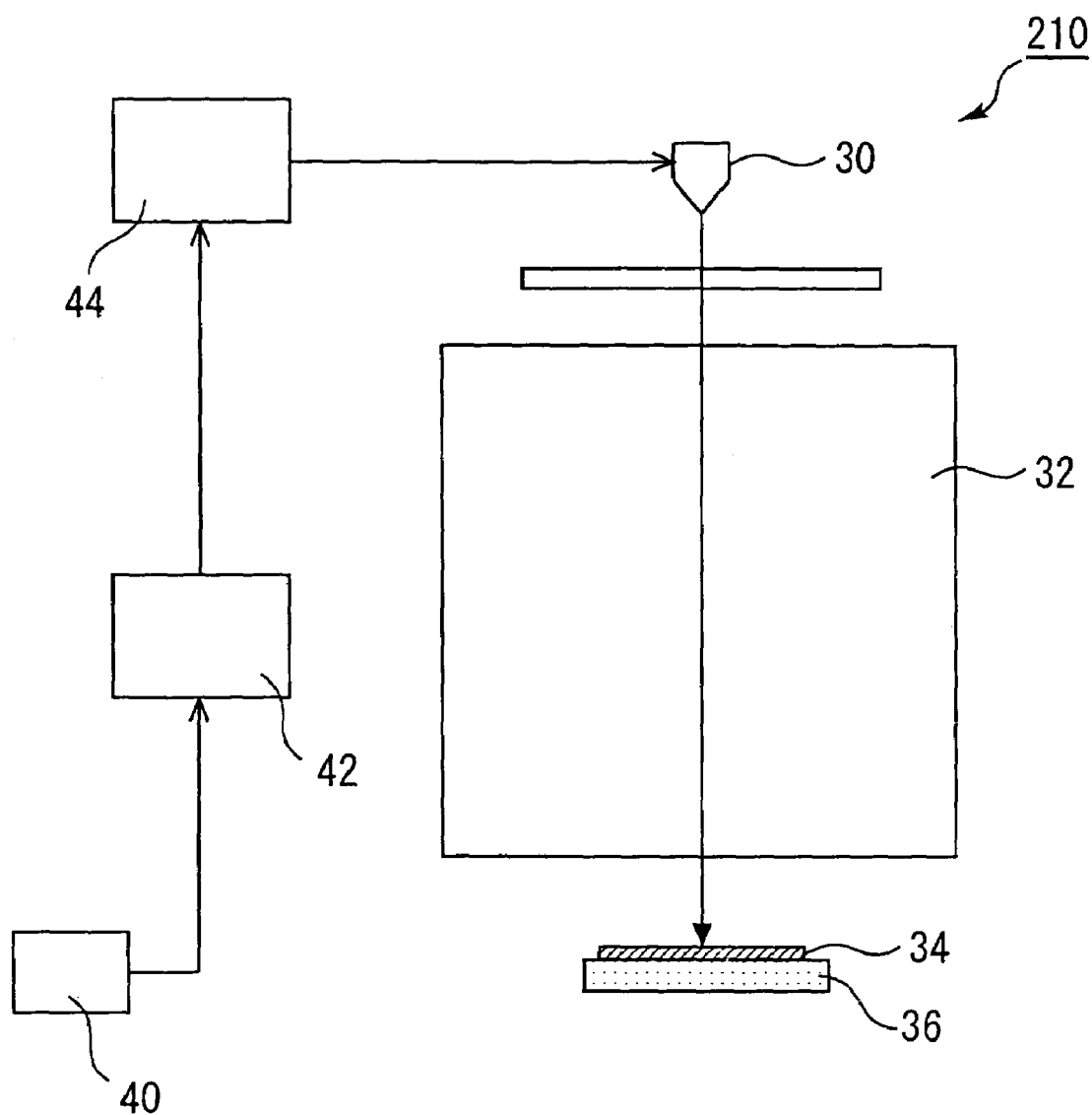
FIG. 13 is a schematic diagram for illustrating the exposing apparatus used in the second embodiment of the present invention.
Figure 14:
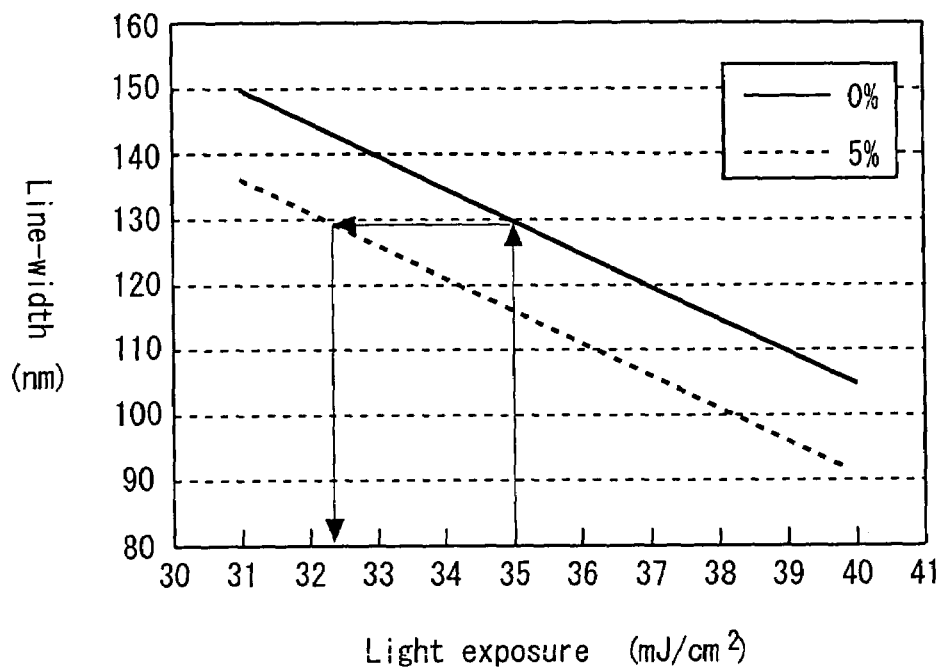
FIG. 14 is a graph showing the relationship between exposure and the line width of the resist when the flare rate is 0% and 5%.
Figure 15:
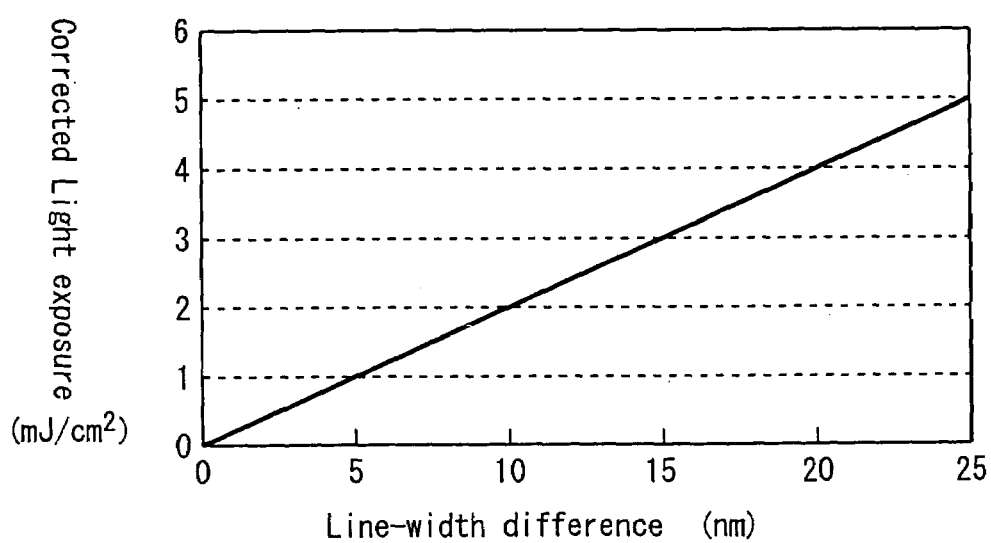
FIG. 15 is a graph showing the relationship between the line-width difference depending on the flare rate, and the exposure for eliminating the line-width difference.
Figure 16:
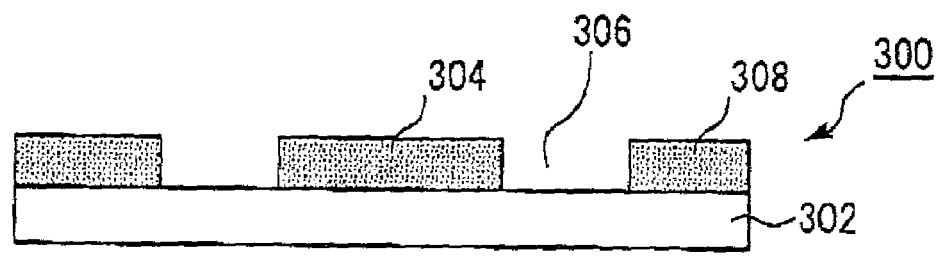
FIG. 16 is a sectional view for illustrating a conventional photomask used for measuring flare.
Figure 17:
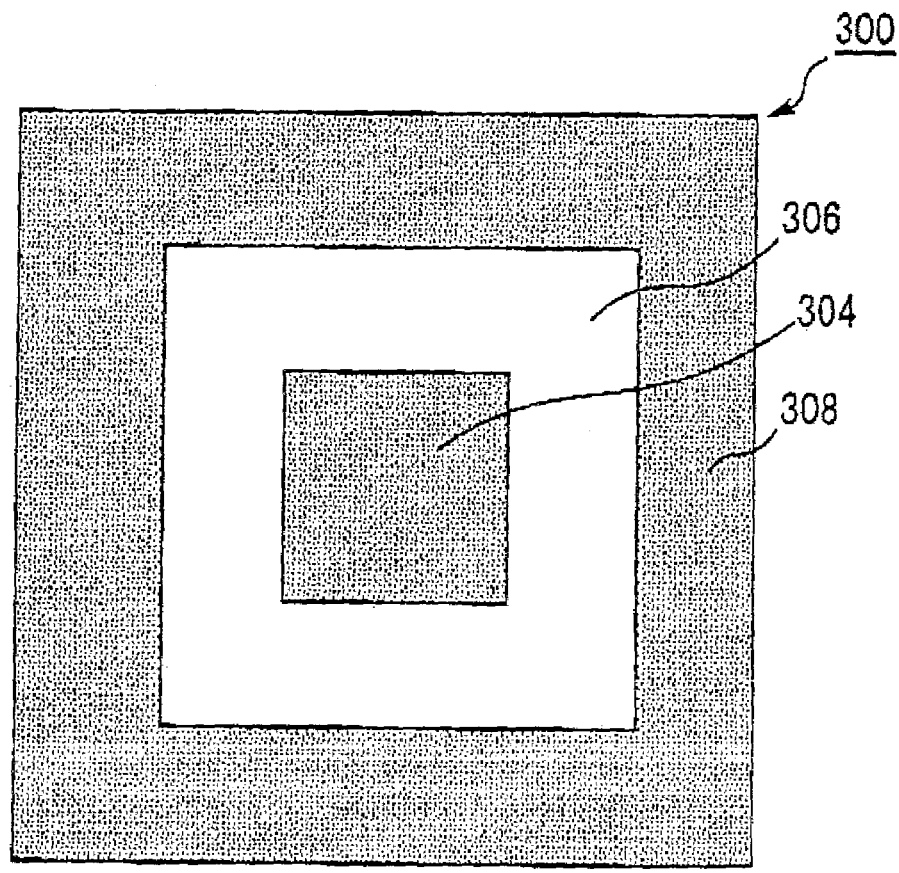
FIG. 17 is a top view for illustrating a conventional photomask used for measuring flare.
Figure 18A:
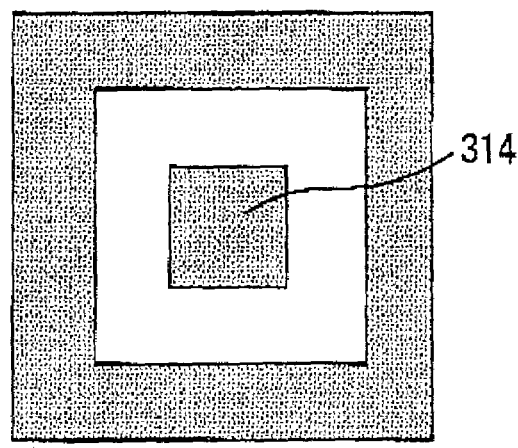
FIGS. 18A to 18C are schematic top views showing the change of the shape of the transferred resist pattern when exposure is changed using the conventional photomask.
Figure 18B:
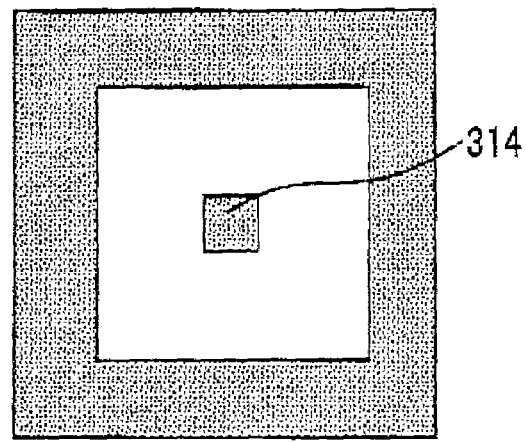
Figure 18C:
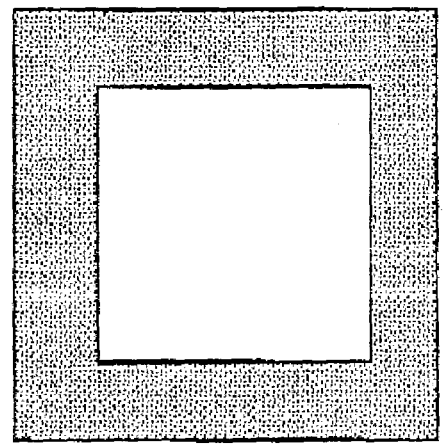

FIG. 12 is a flow diagram for illustrating the exposing method according to the second embodiment of the present invention; FIG. 13 is a schematic diagram for illustrating the exposing apparatus 210 used in the second embodiment of the present invention; FIG. 14 is a graph showing the relationship between exposure and the line width of the resist when the flare rate is 0% and 5%; and FIG. 15 is a graph showing the relationship between the line-width difference depending on the flare rate, and the exposure for eliminating the line-width difference.

The exposing apparatus 210 used in the second embodiment is similar to a general exposing apparatus 200 as described in the first embodiment. However, as FIG. 14 shows, the exposing apparatus 210 is equipped with an input means 40 for inputting the flare rate, a calculation means 42 for calculating corrected exposure from the inputted flare rate, and a control means 44 for controlling the exposure responding to the calculated result.

The calculation means 42 can also convert the line-width difference from the flare rate on the basis of data such as the conversion table shown in FIG. 10; and can obtain exposure for each flare rate for calculated line-width difference on the basis of difference between line-width difference and exposure shown in FIG. 14. The calculation means 42 can also derive data of relationship between line-width difference and corrected exposure in the inputted flare rate, as FIG. 15 shows, from the data showing the relationship between exposure and line-width difference for the flare rate as FIG. 14 shows and can calculate the corrected exposure from these data.

An exposing method using the exposing apparatus 210 will be described below referring to FIGS. 12 to 15.

First, the flare rate related to the pattern to be exposed is entered from the input means 40 (Step S202). The flare rate entered here is the one previously obtained from experiments for the exposing apparatus using a mask as described in the first embodiment. On the basis of the entered data, the calculation means 42 calculates the line-width difference automatically (Step S204). For example, when the flare rate, 5%, is entered, the line-width difference, 13 nm, is automatically calculated on the basis of data on the conversion table shown in FIG. 10.

Next, on the basis of data as shown in FIG. 15, the calculation means 42 calculates the corrected exposure from the line-width difference automatically (Step S206). In the above example, since the flare rate is 5% and the line-width difference is 13 nm, the corrected exposure is calculated as 2.6 mJ. Thereafter, the corrected exposure is transmitted to the control means 44, and the control means 44 controls the exposing light source 30 to deduct the corrected exposure from the actual exposure (Step S208). In this state, exposing is performed (Step S210), whereby the line width of the resist can be controlled before exposing.

By doing as described above, even if local flare is present, exposing can be performed after adequately correcting exposure corresponding to the flare rate. Therefore, patterns can be transferred faithfully to the design.

In the second embodiment, the case wherein the exposing apparatus is equipped with an input means 40, a calculation means 42, and control means 44 was described; however, the present invention is not limited thereto, but other exposing apparatuses can be used as long as the corrected exposure can be calculated for control corresponding to inputted results. Also, the exposing apparatus may not have the calculation means 42, and an operator may calculate the corrected exposure from the graph as FIGS. 14 and 15 show, to control the exposure.

For example, in the first embodiment, the length of the open portion that reaches the-line width B in FIG. 8 corresponds to the threshold value in the present invention. The flare measuring mechanism of the present invention is composed of, for example, a first photomask having the length of the open portion 6 $d_6$ of 0, the second photomask having the length of the open portion 6 of this threshold value, and a conversion table shown in FIG. 10.

Also for example, in the first embodiment, by carrying out steps S12 and S14, the first and second pattern transferring steps of the present invention are performed; by carrying out step S16, the first and second line-width measuring steps are performed; and by carrying out step S18, the calculation step is performed.

Also for example, in the second embodiment, by carrying out steps S202, S204, and S206, the flare-rate input step, the line-width difference calculation step, and the corrected-exposure calculation step of the present invention are performed, respectively; and for example, by carrying out steps S208, and S210, the exposing step is performed.

The features and the advantages of the present invention as described above may be summarized as follows.

According to one aspect of the present invention, the flare irate can be measured easily by measuring the line width of each transferred line pattern using two photomasks having different size of open portions, and obtaining the difference thereof. Therefore, even if the pattern is miniaturized, and patterns with small open portions are formed, the local flare rate corresponding to the miniaturized pattern can be measured more accurately.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-85281, filed on Mar. 26, 2003 including specification, claims, drawings and summary, on which the Convention priority of the present application is based, are incorporated herein by reference in its entirety.

The invention claimed is:

1. A pair of photomasks for measuring flare rate, each photomask comprising:
    a substrate composed of a material transmitting exposing light; and
    a pattern on said substrate of a light-shielding material that does not transmit the exposing light, wherein
    each of said patterns includes
        a central pattern potion having a plurality of line patterns on a central portion of said substrate,
        an open portion where no light-shielding material is located and surrounding said central pattern portion, and
        a peripheral pattern portion located on and proximate a peripheral portion of said substrate, surrounding the open portion and having a plurality of line patterns,
    said central pattern portions of said pair of photomasks have identical configurations,
    the open portions of said pair of photomasks are different in size from each other, and
    said peripheral pattern portions of said pair of photomasks are different in size from each other.

2. The pair of photomasks according to claim 1, wherein the line width of each of said line patterns is at least $\lambda/NA$, where $\lambda$ is the wavelength of the exposing light of an exposing apparatus used for transferring the patterns, and NA is the numerical aperture of a projection lens of the exposing apparatus.

3. The pair of photomasks according to claim 1, wherein said linear portions of said light-shielding material of said plurality of line patterns of said central pattern portions are at least 10 μm in length.

4. The pair of photomasks according to claim 1, wherein the number of said linear portions of said plurality of line patterns of each of said central pattern portions is 9.

5. The pair of photomasks according to claim 1, wherein
    said open portion of one of said photomasks has a width equal to or larger than a threshold value, and
    the threshold value is the width of said open portion when the line width of a transferred pattern corresponding to said plurality of line patterns in said central portion becomes constant, despite widening of said open portion.

* * * * *